United States Patent [19]

Byrnes et al.

[11] 4,423,376

[45] Dec. 27, 1983

[54] CONTACT PROBE ASSEMBLY HAVING ROTATABLE CONTACTING PROBE ELEMENTS

[75] Inventors: Herbert P. Byrnes, Poughkeepsie; Richard Wahl, Fishkill, both of N.Y.

[73] Assignee: International Business Machines Corporation, Armonk, N.Y.

[21] Appl. No.: 245,818

[22] Filed: Mar. 20, 1981

[51] Int. Cl.³ .......................... G01R 1/06; G01R 31/02
[52] U.S. Cl. ............................... 324/158 P; 324/158 F
[58] Field of Search ............... 324/158 P, 158 F, 72.5

[56] References Cited

U.S. PATENT DOCUMENTS 3,806,801  4/1974  Bove ................................. 324/72.5
4,027,935  6/1977  Byrnes et al. ...................... 339/48

OTHER PUBLICATIONS

Dombroski et al., "Floating Bias . . . ", IBM Tech. Dis. Bull.; vol. 18; No. 4; pp. 1038–1039, Sep. 1975.
Clerx, P. P.; "Mechanical Aspects . . . "; Solid State Technology; Jun. 1969; pp. 6, 69, 70.
IBM TDB, vol. 18, No. 5, Oct. 1975, p. 1378.
IBM TDB, vol. 12, No. 4, Sep. 1969, p. 551.

Primary Examiner—Ernest F. Karlsen
Attorney, Agent, or Firm—Wolmar J. Stoffel

[57] ABSTRACT

An electrical probe assembly with rotatable probe elements for establishing electrical contact to pad surfaces having a plurality of elongated probe elements formed of a conductive flexible material, each having a length many times its diameter, spaced upper and lower flat support elements having apertures receiving the ends of the probe elements and maintaining the probe elements in a generally parallel arrangement with at least the lower ends in a configuration corresponding to the pad configuration to be contacted, and a means to simultaneously rotate the probe elements.

12 Claims, 7 Drawing Figures

CONTACT PROBE ASSEMBLY HAVING ROTATABLE CONTACTING PROBE ELEMENTS

DESCRIPTION

1. Technical Field

Our invention relates to probe assemblies for making electrical contact to closely spaced pads on electrical devices and substrates, more particularly to probe assemblies capable of positively establishing electrical contact to a matrix of pads, and still more particularly, to a probe assembly with contact elements having a unique scraping action capable of penetrating surface dielectric layers on the pads.

Semiconductor devices are becoming increasingly complex and miniaturized, often embodying hundreds of circuits on a single chip measuring less than ¼ inch square. With this complexity and density there is required more electrical contacts on less area. These demands have made the matrix arrangement of pads, where pads are arranged in a grid over the entire surface of the chip, a practical necessity.

In the testing of semiconductor devices, the closely spaced pads complicate the making of electrical contact. Needle-like contacts soldered to a card have been developed, of the type described in U.S. Pat. No. 3,849,728. However, such contact assemblies are best adapted to establish electrical contact to only one, or at best, two, peripheral rows of pads. Buckling beam contactor assemblies, as disclosed in U.S. Pat. No. 3,806,801, comprised of long, thin elements disposed perpendicularly to the device surface have the capability of making contact to closely spaced matrix arrays of pads. A modified buckling beam probe is disclosed in U.S. Pat. No. 4,027,935. Such probe assemblies have the advantage that the probe elements can accommodate matrix arrangements of pads. However, they do provide only a limited wiping or scraping action.

Many pads, particularly on semiconductor devices, are formed of aluminum. A genetic layer of $Al_2O_3$ is inherently formed on an aluminum surface upon exposure to air forming a tough coating that makes the establisment of electrical contact very difficult, particularly with very small contact pads necessary in highly miniaturized devices with closely spaced matrix of pads. Any wiping or scraping action of the buckling beam type probe is not sufficient to dependably establish electrical contact.

This invention embodies a rotating probe element action that dependably and consistently scrapes away surface $Al_2O_3$ from aluminum pads, and other similar oxides and coatings to thereby establish good electrical contact.

DISCLOSURE OF THE INVENTION

In accordance with the present invention, we provide an improved probe assembly with rotatable elongated probe elements that are capable of breaking through surface oxide, thin coatings, and the like on contact pads of the device or substrate to be tested, and thereby consistently and dependably establish electrical contact to the pad to permit electrical testing of the device or substrate. The probe of the invention is particularly adapted for the testing of very small, closed spaced pad configurations, particularly pad matrixes formed of aluminum. The probe assembly is capable of breaking through the inherent genetic aluminum oxide layer on aluminum pads, while at the same time allowing for independent, individual contact deflections to accommodate for pad thickness variations. In addition, the probe tips can be very closely spaced thus permitting probing of very small scale contact pad patterns.

The electrical probe assembly of the invention has a plurality of elongated probe elements formed of conductive flexible material, each having a length many times its diameter. Spaced upper and lower flat support elements having apertures receive the ends of the probe elements and maintain the probe elements in a generally parallel arrangement with at least the lower ends supported in a configuration corresponding to the pad configuration to be contacted and protruding beyond the lower support element. A means is provided to simultaneously rotate the probe element to provide a cutting or scraping action. The means to rotate the probe element can be either an actuating element such as a solenoid or air cylinder, or alternatively, an arrangement utilizing the buckling of the probe element when the probe element is brought into contact with the pads and forced downwardly.

BRIEF DESCRIPTION OF THE DRAWINGS

The details of our invention will be described in connection with the accompanying drawings, in which.

BEST MODE FOR CARRYING OUT THE INVENTION

In testing the electrical characteristics of integrated circuits connected to pads on a semiconductor chip for example, by probes in a probe contactor engaging the pad so as to connect the pads to a tester, it is necessary to be able to have each of the pads contacted by a probe with a controlled force to prevent damage to the pad or to the chip. However, the force must be such to make certain that an electrical contact is made to the pad by the probe. In the testing of aluminum pads in particular with conventional probe the force necessary to break the surface oxide may be so high as to damage the probe or the chip. It is also necessary that each element be able to accommodate for pad height variations.

This probe assembly breaks through the surface oxide or other coating by rotation of the probe element which has a sharp cutting edge on the tip.

Figure 1:
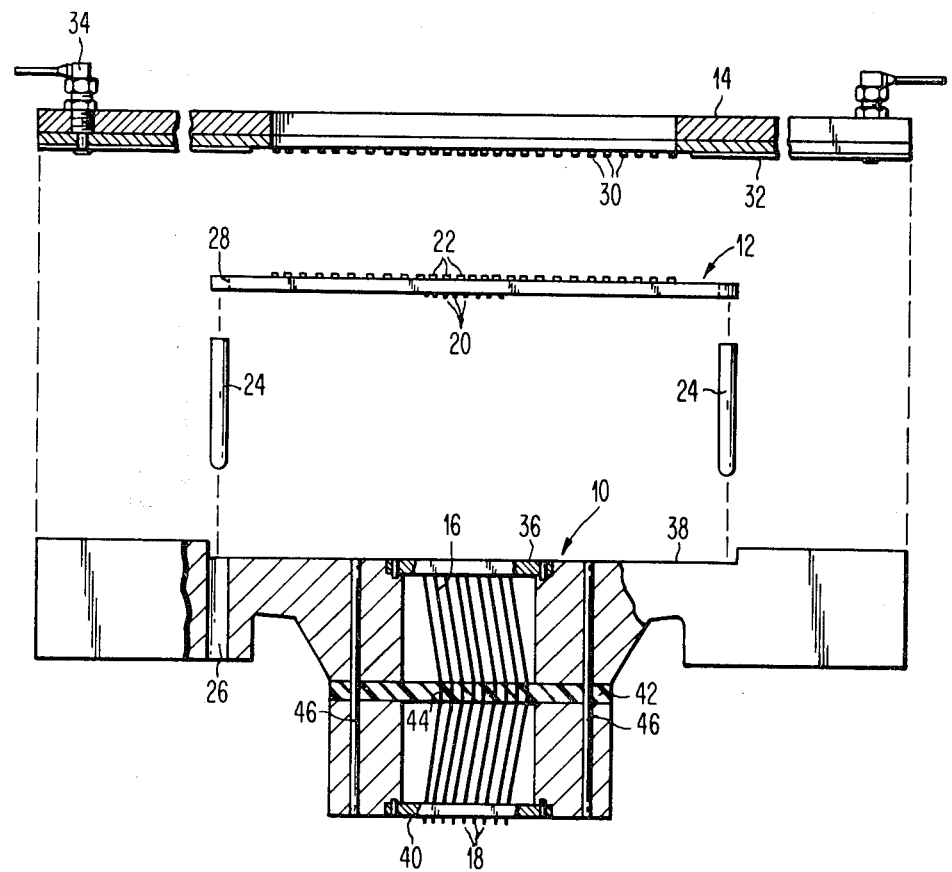
FIG. 1 is an exploded view in broken section of a front view of the overall probe assembly.

Referring now to FIG. 1 of the drawings there is illustrated a preferred specific embodiment of the probe assembly 10 in combination with a space transformer 12 and a printed circuit board 14. Elongated probe elements 16 are mounted in a generally upright or vertical arrangement in probe assembly 10 so that the lower ends 18 protrude to contact the pad configuration on the device or substrate to be tested. Probe elements 16 are supported in a suitable configuration, as for example a grid with the lower protruding ends 18 arranged to correspond to the pad matrix on the substrate to be tested. The upper ends of probe element 16 make electrical contact to a pad configuration 20 on the lower surface of space transformer 12. The space transformer is a suitable element with a fan out pattern that spreads out the contacts 20 to pads 22 on the top surface of space transformer 12. The fan out configuration, not shown in detail, can be of any suitable type in one or more layers on the top or bottom surface of the transformer or sandwiched in the center. Space transformer 12 can be made of any suitable material as for example resin or ceramic. Alignment pins 24 seated in apertures 26 in the probe assembly 10, and in apertures 28 in the space transformer, assure alignment of pads 20 over the ends of probe elements 16. Printed circuit board 14 has a set of contact pads 30 on the lower side thereof in a configuration that matches the pads 22 on the space transformer. Fan out metallurgy 32 further expands the spacing to terminals 34. Terminals 34 are connected to a suitable tester. Thus each probe element 16 in probe assembly 10 is electrically connected to a corresponding terminal 34 in printed circuit board through space transformer 12. The space transformer and printed circuit board assembly is typical of an arrangement for making electrical contact to the probe element 16. Other suitable systems for connecting the probe assembly 10 to a tester can be substituted for the one illustrated.

Probe elements 16 are pre-bent as illustrated in FIG. 1. The upper ends of probe elements 16 are rotatably supported in a flat upper support element 36 mounted on base 38, and the lower ends are supported in a lower flat support element 40, also supported on base 38. A flat probe rotating element 42 receives the central portions of pre-bent probe elements 16 in apertures 44 and is provided with a suitable camming arrangement that constrains movement of the probe rotating element 42 to an arcuate movement. This arcuate movement rotates the probe element 16 approximately 85° or less. Probe rotating element 42 has arcuate cam surfaces, not shown, in which are seated cam follower pins 46. The upper ends of probe elements 16 must make electrical contact to the transformer element 12. This contacting arrangement can be achieved in a various number of ways. As for example the electrical can be established by providing a ball surface 80 preferably plated with an inert metal such as gold, silver, platinum or alloys thereof. Alternately, the end of probe 16 can be provided with a bevelled surface 82 or a wire 84 can be bonded to the end portion protruding above element 36. Yet another technique would be to form a convoluted configuration 86 which can be suitably connected to the connecting circuitry.

Figure 2:
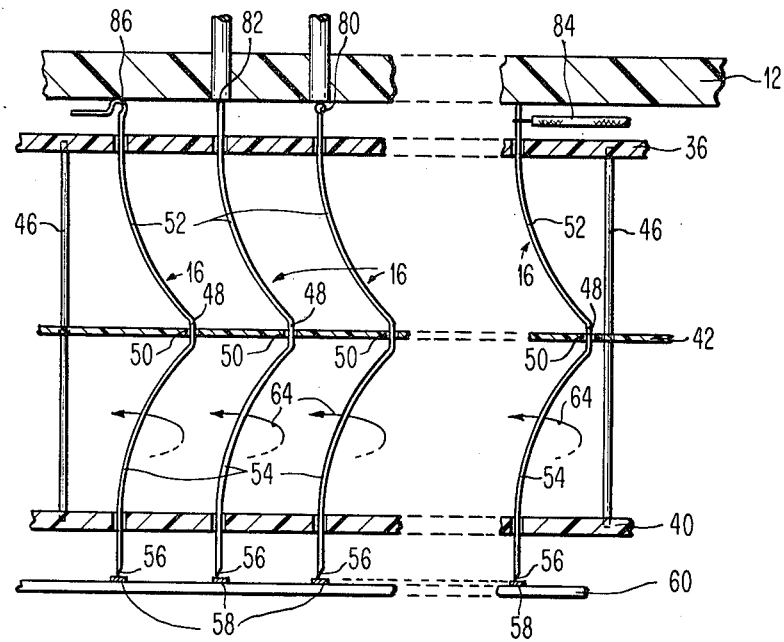
FIG. 2 is an enlarged elevational view in broken section of a probe assembly that illustrates the mode of operation of a preferred specific embodiment of the invention.
Figure 5:
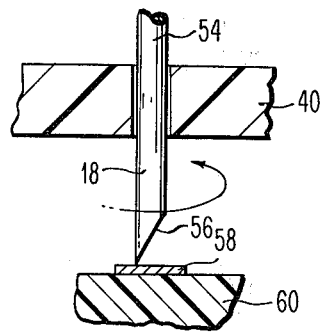
FIG. 5 is a detailed view in enlarged scale illustrating the tip configuration of a probe element and its association to a pad.

Referring now to FIG. 2, the arrangement of rotatable pre-bent probe elements 16 in upper support 36, lower support 40, and probe rotating element 42 is illustrated. Each probe 16 is preferably pre-bent and shaped with a central portion 48 received in aperture 50 of element 42, an upper arcuate-shaped portion 52 joined to central portion 48 and with the upper end making electrical contact with a pad or pin in space transformer board 12, and a lower arcuate portion 54 joined to central portion 48 and with the lower end provided with a sharp point 56 that makes electrical contact with pads 58 on substrate 60. As more clearly shown in FIG. 5, the lower end 54 of probe element 16 is provided with a bevelled surface 56 resulting in a sharp cutting edge. The bevelled surface of the probe will define any suitable angle relative to the surface of pad 58, preferably making an angle in the range of 15° to 60°, most preferably in the range of 30° to 45°.

Figure 4:
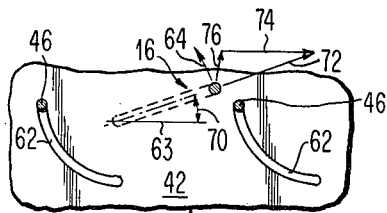
FIG. 4 is a top view in broken section taken on line 4—4, FIG. 3.
Figure 3:
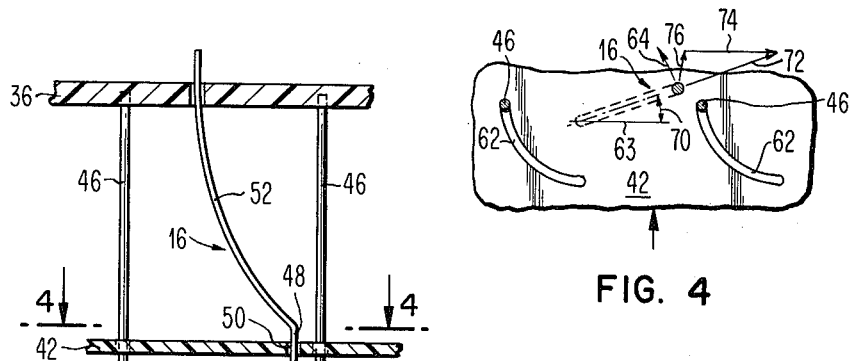
FIG. 3 is an enlarged view in elevated section in simplified form of a single probe to illustrate the mode of operation of a preferred embodiment of the invention.
Figure 7:
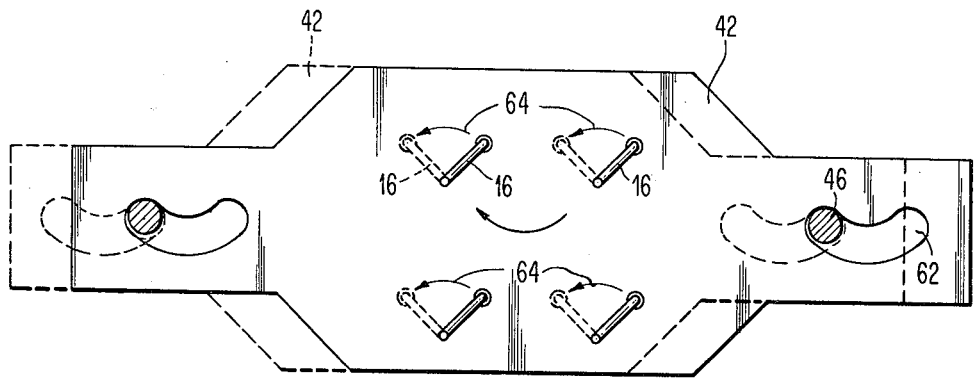
FIG. 7 is another top view of the probe rotating element of another preferred embodiment of the invention.

As most clearly indicated in FIGS. 2 and 3, probe rotating element 42 is located between flat support elements 36 and 40. Probe elements 16 extend through probe rotating element 42 through apertures 50 having the same general configuration as the apertures in elements 36 and 40. Probe rotating element 42 has a camming arrangement that constrains the element to move in an arcuate path to thereby rotate probe element 16 about an arc something less than 90°. The camming arrangement is shown in FIG. 4 wherein camming surface 62 consists of a slot receiving cam follower pin 46. The resulting arcuate movement of probe rotating element 46 is indicated by arrow 64. Probe rotating element 42 can be actuated by any suitable means as for example a solenoid or an air valve connected to a suitable linkage. FIG. 7 illustrates the initial and the final position of the probe rotating element before and after it has been actuated. The solid line figure indicates the initial position and the dotted line figure indicates the subsequent position including the probe element 16.

Figure 6:
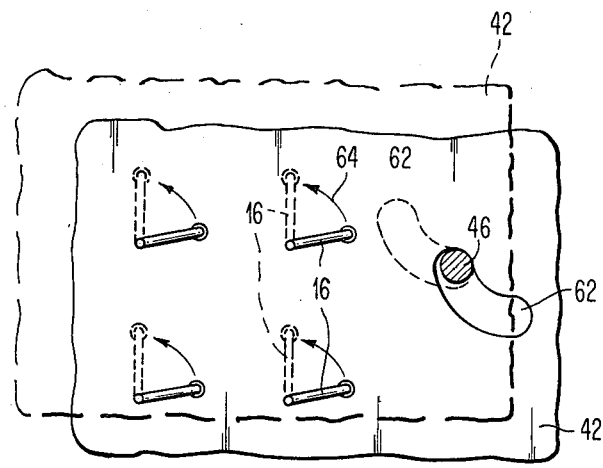
FIG. 6 is a top view of the probe rotating element in broken section of a preferred embodiment from our invention.

In yet another preferred embodiment of the invention, the probe rotating element is actuated by the flexing or bending movement of the probe 16 following contact with the pads 58 on a substrate 60. Each of the probe elements 16 has a length that is many times its diameter. A preferred probe element for use in the practice of the invention has a length in the range of 300 to 900 mils, and a diameter in the range of 2 to 6 mils. Probe elements 16 are formed of a spring-like material, preferably tungsten, BeNi and BeCu. The probe elements are flexed when the probe assembly 12 located over the pads 58 is brought down into contact with the pads and forced downwardly a short distance further. This additional movement makes certain that all of the probe elements contact pads in the event that the top surfaces of the pads are not in the same plane and also bend the pre-bent probe elements outwardly resulting in movement of the probe rotating element 42 along the path dictated by the camming assembly previously described. FIG. 6 illustrates the relative position of the probe rotating element 42 before and after it has been actuated by flexing of the probe element 16. The solid line figure is the initial position and the dotted line figure is the subsequent position after the probes have been rotated. FIG. 4 illustrates the relative position of the camming surfaces and the probe element necessary for movement of the probe rotating element. Note that the initial position of the probe element indicated by 16 is offset from a longitudinal line 63 parallel to an axis connecting cam follower pins 46 as indicated by arc 70. The flexed pin 16 exerts a force 72 which can be broken down into a longitudinal force 74 and a lateral force 76. The camming assembly prevents any movement in the direction of arrow 74 but allows movement in the general direction of arrow 64. Further flexing of the probe element causes the arcuate movement of probe rotating element 42 along the path dictated by the camming assembly, thereby resulting in a partial rotation of probe element 16. The ends of probe elements 16 can be shaped in any suitable manner to suit the particular application. The ends can be flat when the probe is used to contact solder pads since rotation of a flat probe element is sufficient to penetrate any oxide over the relatively soft solder material.

While the invention has been illustrated and described with reference to preferred embodiments thereof, it is to be understood that the invention is not limited to the precise construction herein disclosed and the right is reserved to all changes and modifications coming within the scope of the invention as defined in the appended claims.

We claim:

1. An electrical probe assembly comprising
   a plurality of elongated probe elements formed of conductive and flexible material, each having a length many times its diameter,
   spaced upper and lower flat support elements haaving apertures receiving the ends of said probe elements and maintaining said probe elements in generally parallel arrangement with at least the lower ends in a configuration corresponding to the pad configuration to be contacted, and protruding beyond the lower support element,
   a means to simultaneously rotate said probe element wherein said probe elements are each pre-bent with a central portion displaced laterally from the longitudinal axis through the ends,
   a flat probe rotating element disposed between said upper and lower support elements, said probe rotating element provided with apertures receiving the central portions of said pre-bent probe elements,
   cam surfaces on said probe rotating element,
   cam followers mounted stationery relative to said upper and lower flat support elements and cooperating with said cam surfaces, said cam surfaces and said cam followers adapted to impart an arcuate movement to said probe rotating element which in turn imparts a rotary movement to said probe elements, and
   a means to impart movement to said probe rotating element.

2. The electrical probe assembly of claim 1 wherein said means to impart a movement to said probe rotating element is a solenoid.

3. The electrical probe assembly of claim 1 wherein said means to impart movement to said probe rotating element is an air cylinder.

4. The electrical probe of claim 1 wherein said means to impart movement to said probe rotating element is obtained from the flexing of said probe elements when contact is established between the ends of the probe elements and pads on the substrate, said flexing of the probe elements imparting a component of force on the probe rotating element that drives the probe rotating element in the arcuate path constrained by said cam surfaces and cam followers.

5. The electrical probe of claim 1 wherein said probe elements are each provided with a sharp pointed end that contact the pad.

6. The electrical probe assembly of claim 5 wherein said pointed ends of each of said probe elements is comprised of a bevelled surface disposed at an angle relative to the pad surface to a contact in the range of 15° to 45°.

7. The electrical probe assembly of claim 1 wherein said probe elements are formed of tungsten, each with a diameter in the range of 2 to 6 mils and a length in the range of 300 to 900 mils.

8. The electrical probe assembly of claim 1 wherein the upper ends of the probe elements are each provided with a spherical ball plated with a metal selected from the group consisting of Au, Ag, Pt and alloys thereof.

9. The electrical probe assembly of claim 7 wherein said pre-bent probe elements each has the center portion displaced from the longitudinal axis extending through the ends of the probe elements by a distance in the range of 50 to 150 mils.

10. The electrical probe assembly of claim 1 wherein each of said pre-bent probe elements have a straight center portion having a longitudinal axis parallel to said longitudinal axis through the ends of said probe elements, said center portions of said probe elements rotatably seated in said apertures in said flat probe rotating element.

11. The electrical probe assembly of claim 1 wherein each of said elongated probe elements has a first arcuate shaped portion between the upper end and said center portion, and a second arcuate shaped portion between the lower end and said center portion.

12. The electrical probe assembly of claim 1 wherein said probe elements are each provided with a flat end that contacts the pad.

* * * * *